(12) United States Patent
Healy

(10) Patent No.: US 10,347,231 B2
(45) Date of Patent: Jul. 9, 2019

(54) INDUCTIVE DISTORTION SYSTEM AND METHOD

(71) Applicant: Michael Healy, Keene, NY (US)

(72) Inventor: Michael Healy, Keene, NY (US)

(*) Notice: Subject to any disclaimer, the term of this patent is extended or adjusted under 35 U.S.C. 154(b) by 0 days.

(21) Appl. No.: 15/410,296

(22) Filed: Jan. 19, 2017

(65) Prior Publication Data
US 2017/0132996 A1 May 11, 2017

Related U.S. Application Data

(63) Continuation of application No. PCT/US2015/041485, filed on Jul. 22, 2015.

(60) Provisional application No. 62/027,332, filed on Jul. 22, 2014.

(51) Int. Cl.
*G10H 3/18* (2006.01)
*H03F 3/183* (2006.01)
*H03F 3/19* (2006.01)

(52) U.S. Cl.
CPC ............. *G10H 3/187* (2013.01); *H03F 3/183* (2013.01); *H03F 3/19* (2013.01); *G10H 2210/311* (2013.01); *H03F 2200/03* (2013.01); *H03F 2200/534* (2013.01); *H03F 2200/66* (2013.01)

(58) Field of Classification Search
CPC .............. G10H 3/187; G10H 2210/311; H03F 1/3264; H03F 1/327; H03F 1/3276
See application file for complete search history.

(56) References Cited

U.S. PATENT DOCUMENTS

| 4,688,002 A | 8/1987 | Wingate |
| 6,111,961 A | 8/2000 | Hedrick et al. |
| 6,111,968 A | 8/2000 | Riboloff |

OTHER PUBLICATIONS

International Search Report and Written Opinion of the International Searching Authority issued in PCT Application No. PCT/US2015/41485 dated Oct. 23, 2015.

*Primary Examiner* — Duc Nguyen
*Assistant Examiner* — Kile O Blair
(74) *Attorney, Agent, or Firm* — Heslin Rothenberg Farley & Mesiti P.C.

(57) ABSTRACT

A distortion device includes a transconductance stage, a current amplifier stage electrically coupled to the transconductance stage, and a transformer portion electrically coupled to the current amplifier stage. The transconductance stage includes a first capacitor to provide a ground to a resistor, and voltage across the resistor develops a current through a second capacitor to the current amplifier stage. The current amplifier stage includes a positive half cycle and a negative half cycle. The positive half cycle and the negative half cycle amplify the current from the transconductance stage and supply the amplified current to a primary winding of a transformer in the transformer portion, and the output of the transformer portion includes a low-level signal.

14 Claims, 15 Drawing Sheets

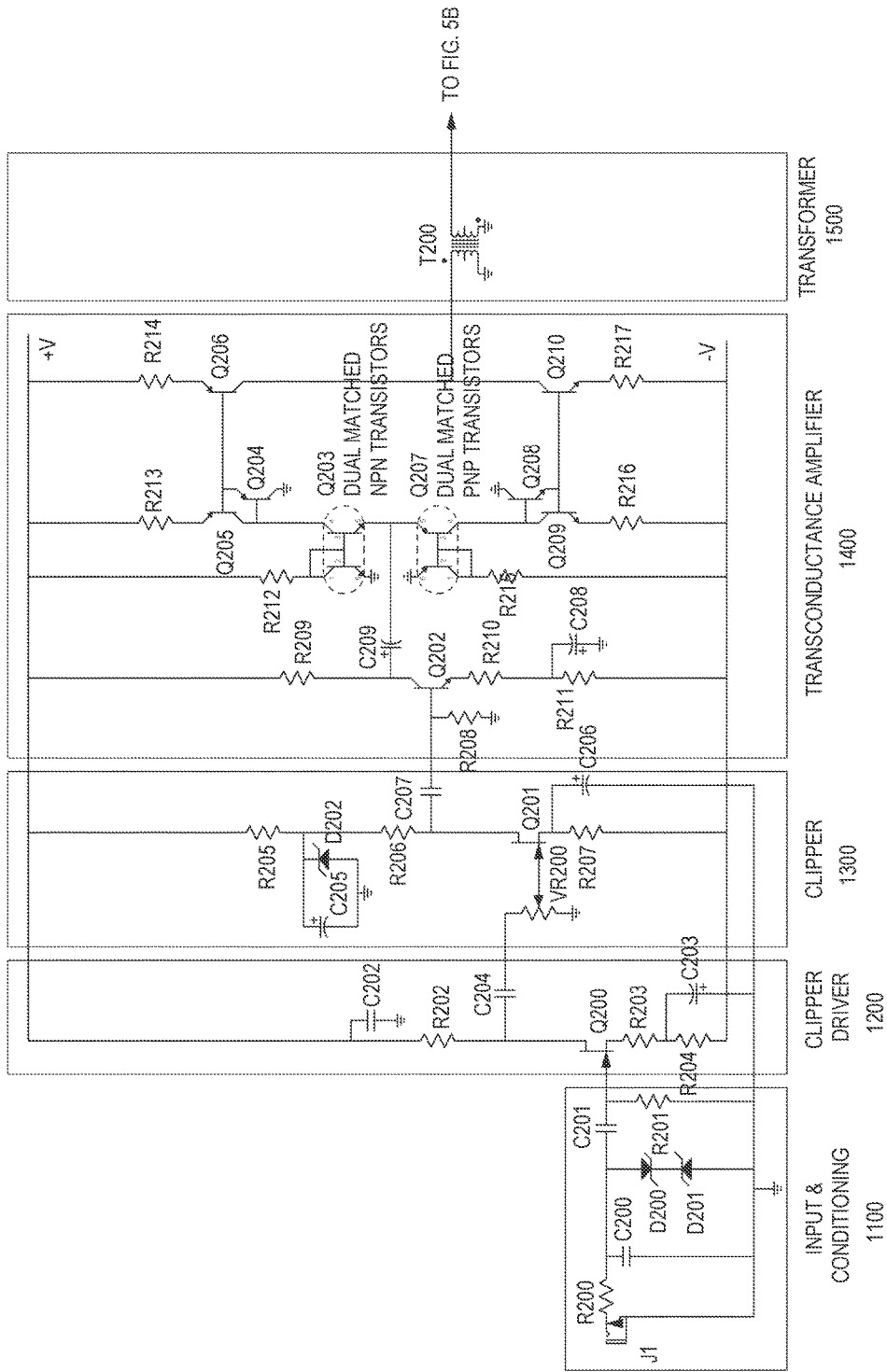

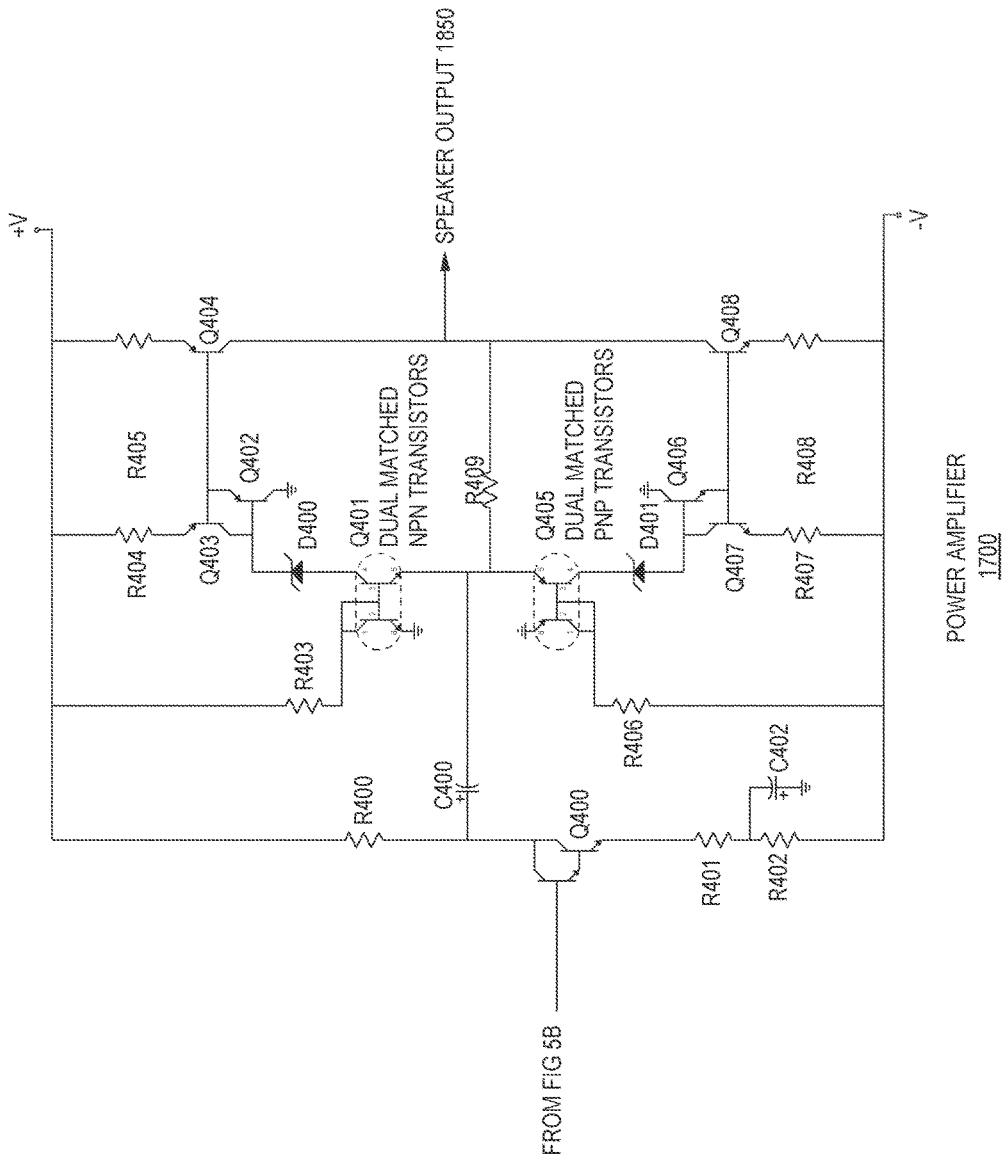

INDUCTIVE DISTORTION SYSTEM AND METHOD

CROSS REFERENCE TO RELATED APPLICATION

This application is a continuation of PCT Application No. PCT/US2015/041485 filed on Jul. 22, 2015, which claimed priority from U.S. provisional patent application No. 62/027,332, filed Jul. 22, 2014, which are hereby incorporated herein by reference in their entirety.

FIELD OF INVENTION

The invention relates generally to systems and methods for creating harmonic and/or intermodulation distortion of an electronic signal.

BACKGROUND OF INVENTION

When utilizing an electronic instrument, including but not limited to electric guitar, varying amounts of harmonic distortion are sometimes desired. Thus, a system that employs adjustable distortion is preferred. In many applications, the harmonic distortion characteristics of tube amplifiers manufactured in the 1950s and the 1960s are considered to be definitive in amplifier design. A number of factors have contributed to the superiority of these tube amplifiers.

Although the amplifiers were not designed to be overdriven, they had to have enough reserve gain to allow for weak guitar pickups. Thus, when a stronger pickup is used, the volume can be increased until tubes, transformers and power supplies are overdriven. Output stages are usually push-pull followed by an impedance-matching transformer which connects to the speaker(s). When gain reaches a level where the tubes are overdriven, the output transformer will begin to go into saturation, creating decreasing even- and odd-order harmonics.

In designing amplifiers presently, modern designers are careful to use matched tubes in the push-pull output stage. In 1950s and the 1960s, tubes were more randomly selected and therefore, unmatched tubes were installed, which possibly contributed to some nice sounding second order harmonic distortion from the unbalanced output transformer.

In a traditional amplifier, in order to get the desired output distortion characteristic, the amplifier must be set to a specific volume. For example, on a given amplifier, a volume setting of "5" might be too "clean" sounding, "8" would be too distorted, and "7" would represent a middle ground. But although the volume of "7" may produce the desired distortion characteristic, this volume would not be appropriate for all performance situations.

A number of approaches to distortion devices have been attempted. In the 1970s, amplifier designers would add an extra stage of pre-amplification, which would allow a pre-amplification tube to be heavily overdriven. This design necessitated a "Drive" pot to control the amount of distortion followed by a "Master Volume" pot to control the signal level to the power amp. In order to get the desired output-transformer distortion, the Master Volume has to be increased to very high levels, which is not always desirable depending on the performance.

Previous approaches included power attenuators, which are connected between the amplifier output and the speaker. The power attenuators allowed the amplifier to be run at a high enough volume to get the desired distortion, while reducing power to the speaker; any extra power is dissipated as heat. This system is problematic because it in expensive, it must be carried, hooked up, the heavy tube amplifier is still required, and a second amplifier and speaker are required for the optional post-distortion effects.

An adjustable-efficiency speaker has also been used for distortion, but it still requires the heavy, expensive tube amp. The efficiency of the speaker can then be decreased, the excess power again being dissipated as heat.

Selectable output power in an amplifier has allowed the user to select the number of output power tubes in service and/or selecting operation in class-A or class-AB. But this approach assumes that the desired distortion characteristic comes only from power tubes, usually pentodes or beam power tubes and thus, only in the highest power configuration would the transformer saturate, contributing its unique distortion characteristics.

A solid-state transconductance power amplifier such as Marshall's ValveState™ amplifier can be used for distortion, but this approach assumes the transconductance characteristics of tubes are the only source of the desired distortion. No output transformer is used.

Digital solutions have also been employed to create desired distortion. Many digital effects manufacturers use an approach where the output sounds from a model amplifier are sampled with a microphone(s), various signals are input to it, and the output is analyzed and digitally simulated.

Analog circuits have been designed to simulate some of the characteristics of transformer saturation.

Finally, there have been experiments with adjustable crossover distortion, but because crossover distortion in class-AB amplifiers is not always desirable, this solution has not been commercialized.

SUMMARY OF INVENTION

Shortcomings of the prior art are overcome and additional advantages are provided through the provision of a distortion device, including: a transconductance stage; a current amplifier stage electrically coupled to the transconductance stage; and a transformer portion electrically coupled to the current amplifier stage, wherein the transconductance stage comprises a first capacitor to provide a ground to a resistor, and wherein voltage across the resistor develops a current through a second capacitor to the current amplifier stage, wherein the current amplifier stage comprises a positive half cycle and a negative half cycle, wherein the positive half cycle and the negative half cycle to amplify the current from the transconductance stage and to supply the amplified current to a collector of a transistor and into a primary winding of a transformer in the transformer portion, and wherein output of the transformer portion comprises a low-level signal.

Further embodiments of the present invention include a distortion device, including: a transconductance stage; a current amplifier stage electrically coupled to the transconductance stage; and an inductor portion electrically coupled to the current amplifier stage, wherein the transconductance stage comprises a capacitor to provide a ground to a resistor, and wherein voltage across the resistor develops a current through a capacitor to the current amplifier stage, wherein the current amplifier stage comprises a positive half cycle and a negative half cycle, wherein the positive half cycle and the negative half cycle to amplify the current from the transconductance stage and to supply the amplified current to a collector of a transistor and into a resistor in the inductor portion, wherein the resistor provides a resistive load for an inductor in the inductor portion, and wherein output of the inductor portion comprises a low-level signal.

Further embodiment of the present invention include an amplifier including a distortion device, wherein the distortion device includes: a signal source; a transconductance stage coupled to the signal source, wherein the transconductance stage comprises a capacitor to provide a ground to a resistor, and wherein voltage across the resistor develops a current through a capacitor to a current amplifier stage; the current amplifier stage, wherein the current amplifier stage comprises a positive half cycle and a negative half cycle, wherein the positive half cycle and the negative half cycle amplify the current from the transconductance stage and to supply the amplified current to a saturation portion; and the saturation portion, wherein the saturation portion comprises a transformer or an inductor and the transformer or the inductor is supplied amplified current by collectors of the transistors in the current amplifier stage.

Additional features are realized through the techniques of the present invention. Other embodiments and aspects of the invention are described in detail herein and are considered a part of the claimed invention.

BRIEF DESCRIPTION OF DRAWINGS

The foregoing and objects, features, and advantages of one or more aspects of the invention are apparent from the following detailed description taken in conjunction with the accompanying drawings in which:

FIG. 5A-5C depict aspects of an amplifier utilizing an embodiment of the distortion device of the present invention;

DETAILED DESCRIPTION OF THE INVENTION

The present invention utilizes inductors and/or transformers as distortion devices. These distortion devices can be integrated into an amplification system for an electronic instrument, including but not limited to, electric guitar. Further embodiments of the present invention include methods of using embodiments of an inductive distortion device and methods of making an embodiment of an inductive distortion device.

Figure 1:
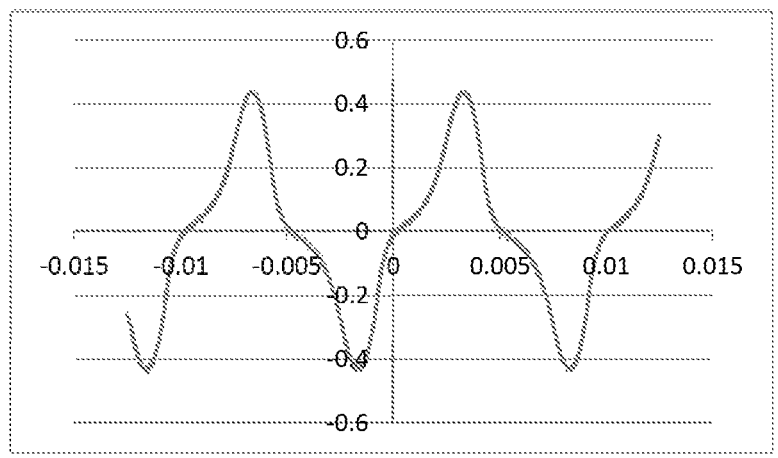
FIG. 1 depicts an example of saturated transformer output.
Figure 2:
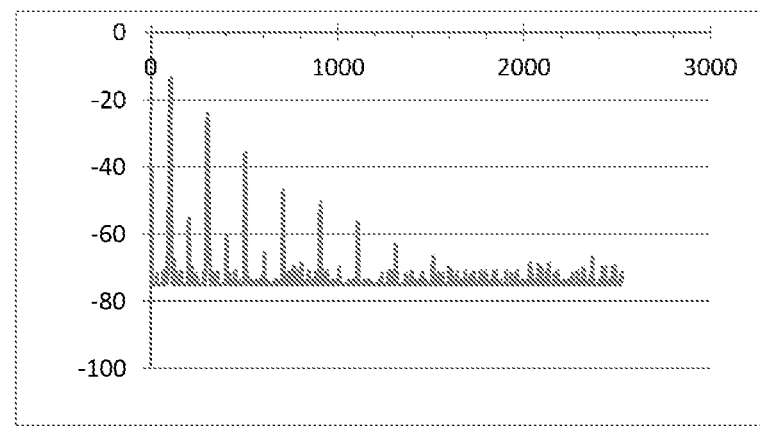
FIG. 2 depicts the harmonic spectrum of FIG. 1.

Embodiments of the present invention utilize a transformer and/or an inductor in conjunction with a current source to provide distortion within an amplification system. As discussed in conjunction with older amplifiers, amplifiers were not designed to be overdriven and when gain reached a level where the tubes were overdriven, the output transformer would begin to go into saturation, creating decreasing odd-order harmonics. FIG. 1 represents saturated transformer output utilizing a 100 Hz sine wave input, and FIG. 2 illustrates the harmonic spectrum of FIG. 1.

In embodiments of the present invention, a transformer and/or an inductor is integrated into an amplification system, such as an amplifier for an electric guitar. As a component of this system, the transformer and/or inductor is part of an inductive distortion device that contributes to the desired sound of the system, i.e., the distortion. Embodiments of the present inductive distortion device utilize a transconductance amplifier or other current-output device, including but not limited to vacuum tubes, to drive a transformer and/or inductor in the circuitry of the device. Some embodiments of the present invention place the aforementioned transformer and/or inductor in a feedback loop around a high-power op amplifier. As stated earlier, embodiments of the present invention utilize one of either an inductor or a transformer to achieve the desired distortion.

Embodiments of the present invention utilize a low-power saturating transformer and/or inductor distortion stage in the circuitry of the device to achieve a tube-amplifier type sound at a low signal voltage level. This stage is described in greater detail in conjunction with, for example, FIGS. 3-4. The transformer and/or inductor output of an embodiment of the present invention can then be routed through a volume control to the power amplifier stage. In a further embodiment of the present invention, the low-level signal can also be routed through equalization, reverberation, and/or other effects. Additionally, in embodiments of the invention, desired distortion levels can be achieved at a variety of different volume levels.

An advantage of utilizing a transformer or inductor in embodiment of the present invention, is that due to the inductive reactance of the driven winding, the transformer or inductor iron core does not saturate as deeply at higher frequencies, resulting in less distortion at these frequencies. This is an advantage when playing chords on an electric guitar coupled to an embodiment of an inductive distortion device, because higher notes can be distinguished more clearly despite the distortion on the low notes. This clarity enables complex chord structures to be discernible to the listener without the individual playing the electric guitar using excessive treble, as required with previous distortion devices.

Another advantage of the present invention is that at low distortion levels, the sounds are smoother than previous distortion attempts, which is useful for, e.g., classic jazz or country music. Moderate distortion levels are appropriate for blues or rock. At high distortion levels, the severely distorted signal provides punk-like power chord sounds. At levels below distortion, the sound is very clean and transparent.

Embodiments of the present invention may utilize a voltage-output amplifier with current-limiting or current-control devices.

In some embodiments of the present invention that utilize a transformer, the transformer is preferably small enough to be able to control the output level with a standard ½-watt potentiometer, and large enough to reproduce bass notes without severe signal loss.

Figure 3:
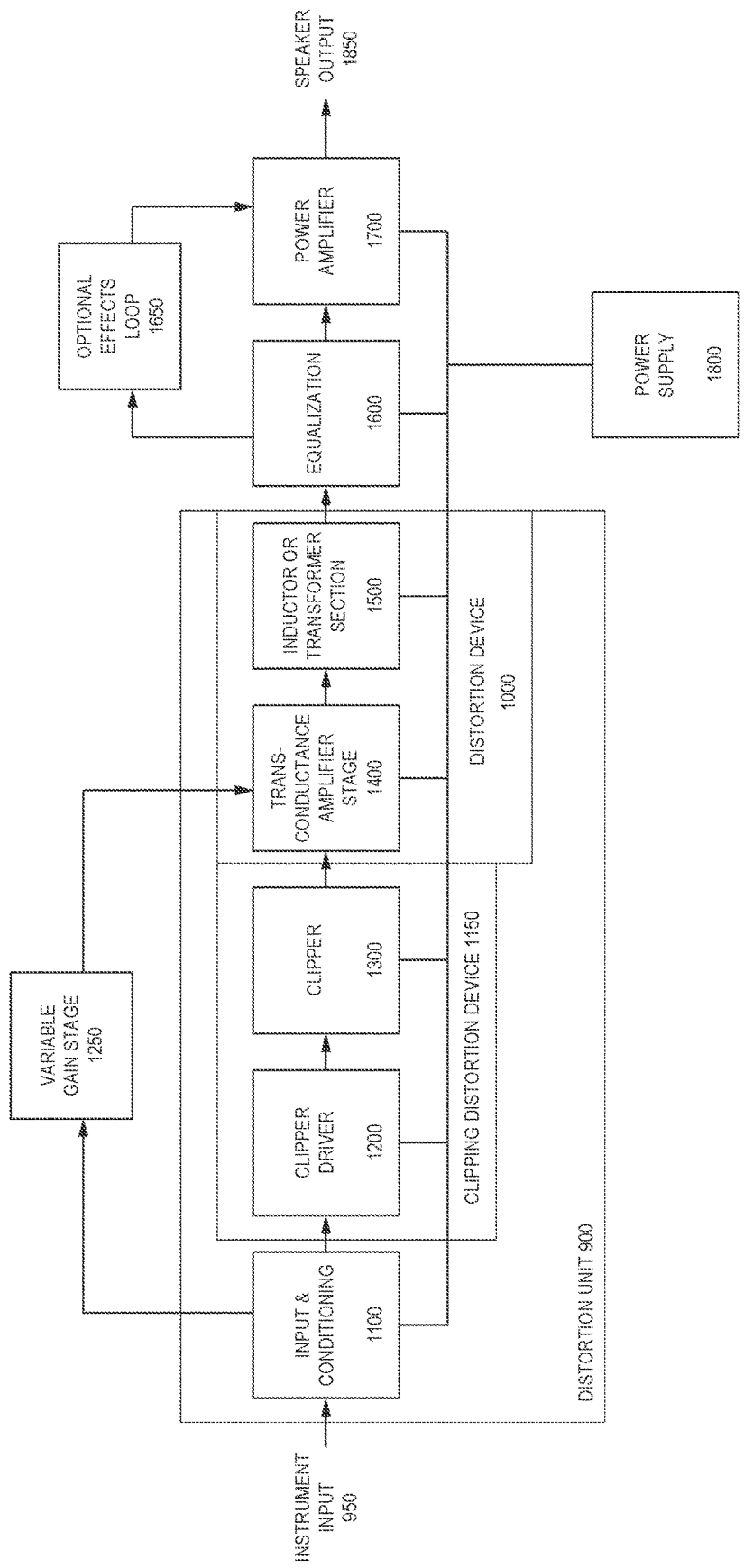
FIG. 3 depicts a block diagram of a musical instrument amplifier including aspects of an embodiment of the distortion device of the present invention.

FIG. 3 depicts an embodiment of a distortion device 1000 integrated into a distortion unit 900 in a musical instrument amplifier 800. The inductive distortion device 1000, can also be referred to as a distortion generator. As aforementioned, embodiments of the distortion device of the present invention can be integrated into an amplifier, which is shown in this figure. In FIG. 3, the distortion device 1000 is utilized in a musical instrument amplifier 800.

As seen in FIG. 3, in an embodiment of the present invention, a distortion unit 900 in a musical instrument amplifier 800 is comprised of and input and conditioning circuit 1100, a variable gain stage 1250, a clipping distortion device 1150, and the aforementioned inductive distortion device 1000. In an embodiment of the present invention, instrument input 950 is obtained by the input and conditioning circuit 1100, which supplies a signal to a clipping distortion device 1150 that includes of a clipper driver 1200 and a clipper 1300 and/or to a variable gain stage 1250. While the embodiment of the distortion unit 900 of FIG. 3 includes both a clipping distortion device 1150 and a variable gain stage 1250, embodiments of the present invention may include one or the other.

In an embodiment of the present invention where the input and conditioning circuit supplies the clipper distortion device 1150, including the clipper driver 1200 and a clipper 1300, clipper 1300 provides a signal to the distortion device 1000 which may be clipped (limited) at the positive, negative or both extremities of the input signal.

In the distortion unit 900 of FIG. 3, the distortion device 1000 obtains a signal from either the clipping distortion device 1150 or the variable gain stage 1250. In an embodiment of the present invention, the distortion device 1000 includes a transconductance amplifier stage 1400, and an inductor or transformer section 1500. Transconductance amplifier 1400 receives an AC voltage input from clipper 1300 or from variable gain stage 1250 and converts it to an AC current signal, which is then amplified and output to inductor or transformer section 1500. Inductor or transformer section 1500 converts the amplified current signal and converts it back into an AC voltage signal. The output signal may be scaled to a voltage appropriate to or compatible with the circuitry by the secondary of the transformer or by a resistive voltage divider when a inductor is used.

The scaled AC output voltage from the distortion device 1000 is then processed by equalizer 1600, and/or by an optional effects loop 1650, which may include, but is not limited to a reverberation or a direct line out to a public address (PA) system. In the embodiment of FIG. 3, a final stage is a variable gain power amplifier 1700 which drives a loudspeaker.

Figure 4:
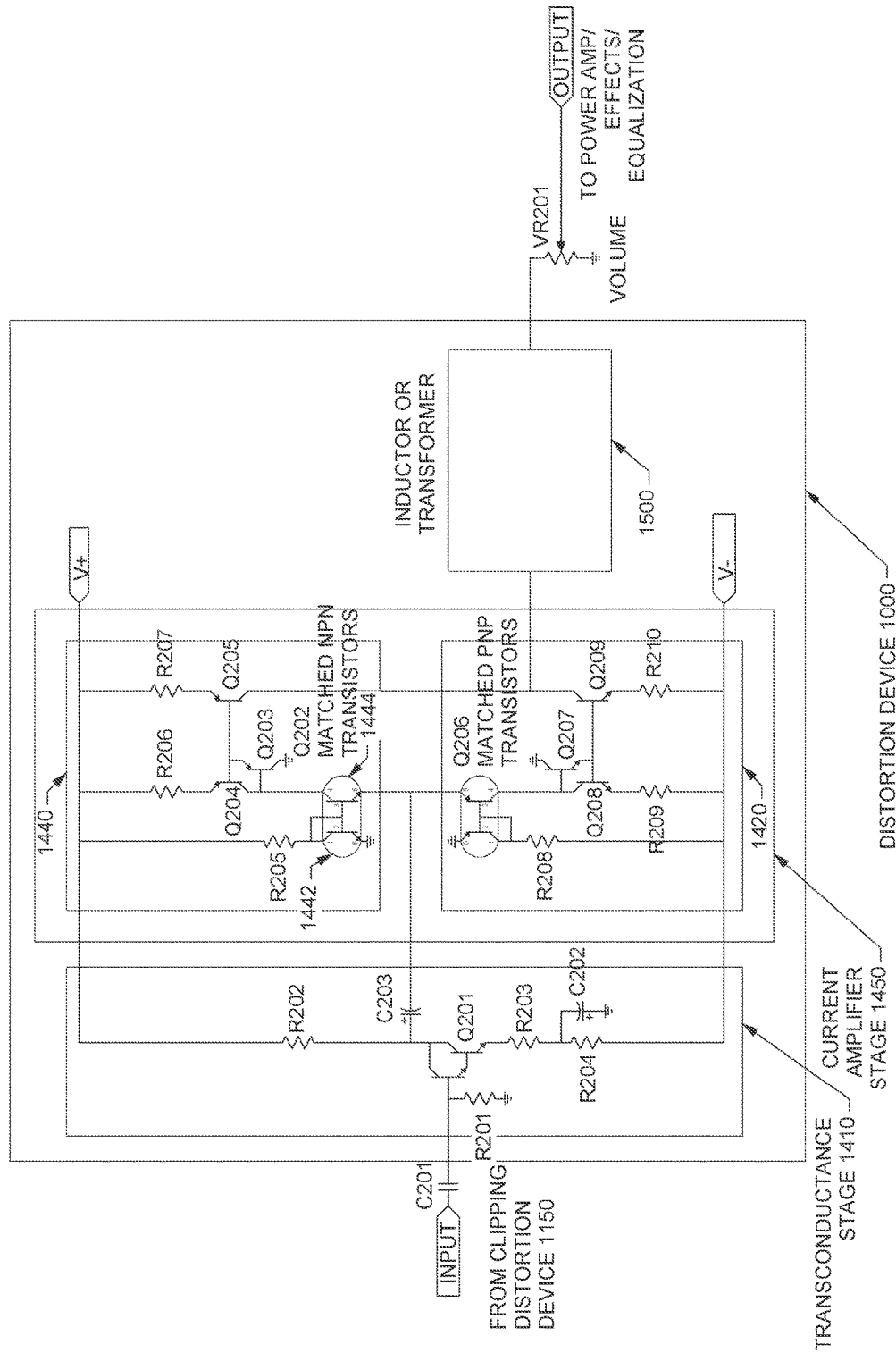
FIG. 4 depicts a block diagram of a musical instrument amplifier including aspects of an embodiment of the distortion device of the present invention.

FIG. 4 is an embodiment of the circuitry associated with an embodiment of the present invention that utilizes a inductor or transformer section 1500, for example, transformer T1, or inductor L1 as a component in a distortion device 1000 that can be integrated into an amplifier. The use of either an inductor or a transformer was earlier explained in reference to the inductor or transformer section 1500 element of the distortion device 1000 of FIG. 3. For ease of understanding, the same identifiers are used across certain figures to denote similar structures. For example, the inductor or transformer section 1500 of FIG. 3 is an element of the embodiment of FIG. 4, as is a distortion device 1000.

FIG. 5 is an embodiment of the circuitry of an amplifier integrating an embodiment of a distortion device 1000 (of FIG. 3), of the present invention, of FIG. 4. Although both FIG. 4 and FIG. 5 contain specific circuit elements, one of skill in the art will recognize that many variations exist that can employ the innovations of the present invention and are considered embodiments of this invention. FIGS. 4-5 are offered as illustrative non-limiting examples of possible circuitry that can be utilized in embodiments of the present invention.

Returning to FIG. 4, for ease of understanding, the circuitry is separated into a transconductance stage 1410, a current amplifier stage 1450, and a transformer or inductor portion 1500. This embodiment can be contrasted with the embodiment of FIG. 3, which includes a joint transconductance amplifier stage 1400. Returning to FIG. 4, in the transconductance stage 1410 of the inductive distortion device 1000, the output of a clipper distortion device 1150 is coupled through capacitor C201 to the base of Darlington transistor Q201. Resistor R201 holds the base of Darlington transistor Q201 to near ground potential. Resistors R203 and R204 set the quiescent bias current of Q201.

Figure 10A:
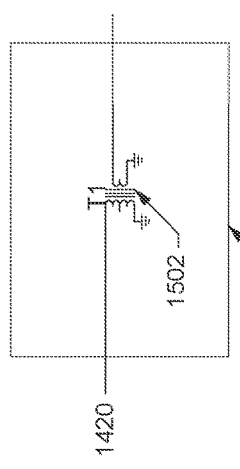
FIGS. 10A-10C depict various embodiment of an inductor or transformer section of embodiments of the distortion device of the present invention.
Figure 10B:
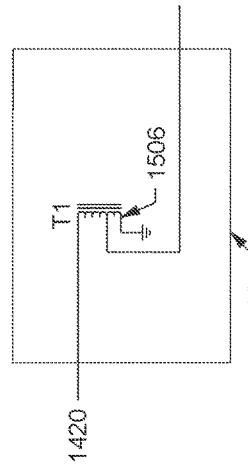
Figure 10C:
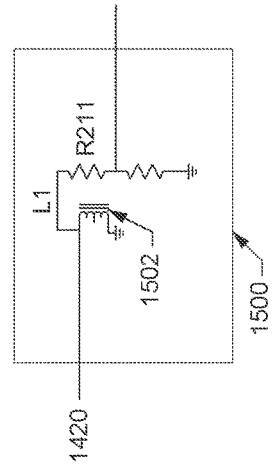

FIGS. 10A-10C, which will be discussed later, include alternate embodiments of possible elements of the inductor or transformer section 1500 in the embodiment of FIG. 4.

Referring to FIG. 4, capacitor C202 provides AC ground to the junction of resistor R203 and resistor R204. Meanwhile, resistor R202 sets the collector voltage of Darlington transistor Q201

The aforementioned AC voltage across resistor R203 develops an AC current through the collector of Darlington transistor pair Q201, which is coupled through capacitor C203 to the current amplifier stage 1450 in an embodiment of the circuitry of the present invention.

Returning to FIG. 4, the current amplifier stage 1450 of the present invention in the distortion device 1000 (also referred to as an inductive distortion device) includes a positive half cycle 1440 and a negative half cycle 1420. The positive half cycle 1440 is depicted as the upper half of the current amplifier stage 1450 and the negative half cycle 1420 is the lower half. Both halves operate in a similar manner.

Referring to the positive half cycle 1440 of the current amplifier stage 1450, the transistor pair Q202 consists of two NPN transistors with matched VBE (voltage that falls between the base and emitter of a bipolar junction transistor) on a common substrate so that they are thermally connected. In order to prevent crossover distortion, in an embodiment of the present invention, the current input from capacitor C203 to current amplifier stage 1450 is referenced to ground. Referring to positive-half current amplifier 1440, a bias current flows from V+ through R205 into diode-connected transistor 1442, which then develops a VBE proportional to the log of the current. This base voltage is connected to the base of transistor 3444, forcing it to have the same VBE drop as 1442, so that the emitter of transistor 1444 is at the same potential as the emitter of transistor 1442, i.e., ground potential. Now a quiescent current, which matches the current into transistor 1442, flows from V+ to V− by going through R206, Q203, Q204, 1444, Q206, Q207, Q208 and R209.

Referring to positive-half current amplifier 1440, when a negative-going signal from capacitor C203 appears at the emitter of 1444, the emitter voltage goes slightly negative, for example, at about 0.06 volts per decade of current input. A small fraction of this current (e.g., about 1%) may be drawn from the bias current from R205. The remainder of the current can be drawn from V+ through R206, Q204 and Q203.

Referring to positive-half current amplifier 1440, the network of R206, R207, and Q203-Q205 is configured as an amplifying current mirror. The current from transistor 1444 goes through Q204 and helper transistor Q203, causing a voltage drop in resistor R206. Since the bases of Q204 and Q205 are connected, the voltage drop in resistor R207 will approximately match the voltage drop in R206.

In an embodiment of the present invention, if the resistance of R207 is less than the resistance of R206, then by Ohm's law the current in R207 will equal the current in R206 multiplied by the ratio R206/R207, thus amplifying the current. In this non-limiting example, nearly all of the current through R207 will be sourced from the collector of R207 into transformer or inductor section 1500. If Q205 becomes significantly hotter than Q204, its VBE decreases relative to the VBE of Q204, causing an increase in the voltage across R207, which increases the current in the transistor Q205. This causes Q205 to heat up further, and in an extreme case it may lead to thermal runaway. Therefore, it may be necessary to thermally connect Q204 and Q205.

As aforementioned, in the embodiment of FIG. 4, the negative half cycle 1420 is amplified in a similar manner by transistor pair Q206 and transistors Q207-Q209 and associated components, as depicted in FIG. 4.

Referring both to FIG. 4 and the inductor or transformer section 1500 depicted in FIG. 10B, once the resultant current is sourced and/or sunk by the collector of transistors Q205 and Q209, respectively, into primary winding of transformer T1, the processing in the circuit has progressed to the inductive portion. As discussed earlier, in embodiments of the present invention, an inductor can be used in place of a transformer. The inductor or transformer section 1500 of FIG. 4, as depicted as alternative and non-limiting embodiments in FIGS. 10A-10C can be referred to as the inductive portion of the distortion device 1000.

Returning to FIG. 4, the inductor or transformer section 1500, which is the inductive portion of the distortion device 1000, may include a number of different configurations. In FIG. 10A, the inductor or transformer section 1500 includes a transformer T1. In FIG. 10B, the inductor or transformer section 1500 includes an autotransformer. In the embodiment of FIG. 10C, the inductor or transformer section 1500 includes an inductor L1.

Turning to the inductor or transformer section 1500 of FIG. 10A, a secondary winding provides a low-level signal for effects, equalization and power amplifier input. In the inductor or transformer section 1500 of FIG. 10B, similarly, a secondary portion of the transformer coil provides the low-level signal. In the inductor or transformer section 1500 of FIG. 10C, a voltage divider formed by R211 and VR201 (FIG. 4) reduces the inductor voltage to a desired low level output.

Embodiments of the present invention may utilize a transconductance amplifier or other current-output devices, including but not limited to, vacuum tubes, to drive a transformer, such as transformer or autotransformer 1504 in FIG. 10B or inductor L1 in FIG. 10C. In an embodiment of the present invention, a voltage-output amplifier with current-limiting or current-control devices could also be utilized. In an embodiment of the present invention, the transformer primary winding can also be placed in a feedback loop around a high-power op amplifier.

Returning to FIG. 4, when the inductor or transformer section 1500 includes a transformer T1 (FIG. 10A), the output of the transformer T1, can then be routed through a volume control variable resistor VR201, to a power amplifier stage, such as the power amplifier 1700 of FIG. 3.

Figure 5B:
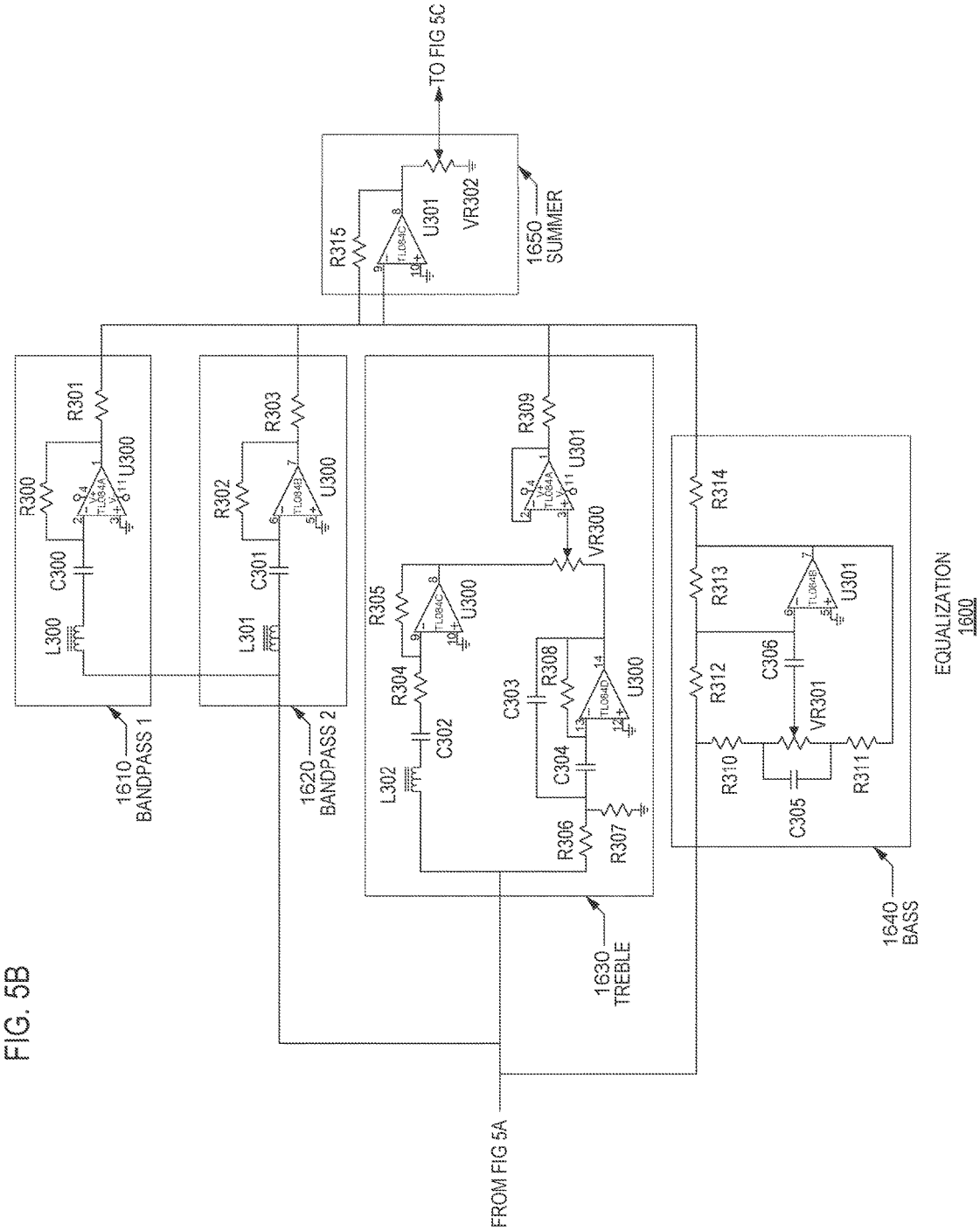

Turning now to FIGS. 5A-5C, these figures depict non-limiting examples of portions of the circuitry of a guitar and/or other musical instrument or sounds amplifier that can accommodate certain aspects of FIGS. 3-4, including embodiments of the distortion device 1000. One of skill in the art will recognize that the embodiment of an amplifier depicted FIGS. 5A-5C is an example of the circuitry of one amplifier that can include circuitry described of various embodiments of the present invention Referring first to FIG. 5A, resistors R200 and R201, capacitors C200 and C201, and (e.g., Zener) diodes D200 and D201 comprise an input circuit that provides static protection and input impedance matching in this embodiment. Resistor R200 may be a carbon composition resistor. Zener diodes D200 and D201 limit the input voltage to safe levels for the following circuitry. Capacitor C200 slows the rise time of static discharge signals to give the Zener diodes D200 D201 enough time to begin conduction. The value of capacitor C200 is low so that it does not interfere with audio signals. Meanwhile, capacitor C201 provides DC isolation between the input and the first amplification stage, which will be discussed later. Resistor R201 presents an input load and sets the gate bias voltage for the clipper driver 1200.

In FIG. 5A, a clipper driver 1200 (like the clipper driver 1200 of FIG. 3) r, which can be described as a low noise high gain JFET (Junction Field-Effect Transistor) amplifier stage, is provided by transistor Q200, resistors R202-R204, and capacitors C202 C203. At this stage, in this embodiment, resistors R203 and R204 set the DC source current for transistor Q200. Resistor R202 sets the operating point voltage for transistor Q200. Capacitor C203 provides AC ground for the amplification of input signals. Resistor R203 provides source degeneration to limit gain and to help make the signals linear. Capacitor C204 couples the output of the stage to variable resistor VR200.

After the clipper driver 1200, a clipper stage can also be understood as an amplification and clipping distortion stage. This stage is provided by transistor Q201, variable resistor VR200, resistors R205-R207, capacitors C205-C207, and Zener diode D202. In FIG. 5A, resistor R205, Zener diode D202, and capacitor C205 provide a low supply voltage for this stage, which provides transistor Q201 with a low supply voltage and gives a softer clipping characteristic than would be available from a higher voltage supply. In the clipper 1300, variable resistor VR200 sets the gain of the $2^{nd}$ stage and provides a ground reference for the gate of Q201. Resistor R207 sets the DC source current for JFET transistor Q201 and capacitor C206 provides AC ground to transistor Q201 source. Resistor R206 sets the operating point for transistor Q201. Capacitor C207 couples the output of transistor Q201 to a transconductance amplifier stage 1400.

The embodiment of FIG. 5A further includes a third amplification stage, which is pictured in the transconductance amplifier 1400 portion of FIG. 5A. This stage is provided by transistors Q202-Q210, capacitors C208 and C209, and resistors R208-R217. The amplifier is a transconductance (i.e., voltage in, current out) amplifier. This portion was described in more detail in FIG. 4.

Following the "Transconductance Amplifier" portion of FIG. 5A, is a transformer stage, which includes transformer T200. Aspects of this portion of the guitar amplifier of FIG. 5A are described in greater detail in FIG. 3.

Turning to FIG. 5B, this figure represents a portion of a guitar amplifier including the distortion device 1000 that provides equalization 1600 and specifically, is responsible for a portion of the sound of the amplifier, which has the unique qualities described in the present specification. The equalization 1600 pictured in this embodiment is offered as an example. Although this portion of an amplifier that includes the disclosed distortion device 1000 may contribute to the sound of the amplifier as a whole, it may not contribute to the distortion achieved by the distortion device 1000 itself. However, in FIG. 5B, equalization 1600 within the amplifier is provided by resistors R300-R315, variable resistors VR300-VR302, capacitors C300-C306, inductors L300-L301, and quad op-amplifiers U300-U302. This circuit depicted in 5B provides the unique "signature sound" of the amplifier as a whole. In the pictured embodiment of the present invention, this aspect is divided in five portions, which will be described separately: Bandpass 1 1610, Bandpass 2 1620, Treble 1630, Bass 1640, and Summer 1650.

Referring to FIG. 5B, the Bandpass 1 1610 portion of the circuit, U300A, inductor L300, capacitor C300, and resistors R300 and R301, all provide a high-Q LC bandpass filter. The output level of this filter is scaled by resistor R301.

The Bandpass 2 1620 portion includes U300B, inductor L301, capacitor C301, and resistors R302 and R303, which provide a high-Q LC bandpass filter. Its output level is scaled by resistor R303.

The Treble 1630 can be understood as three portions: treble boost, treble cut, and treble blend. The Treble 1630 boost includes U300C, inductor L302, capacitor, C302 and resistors R304 and R305, which provide a low-Q LCR bandpass filter for treble boost. The Treble 1630 cut includes U300D, resistors R306-R308, and capacitors C303 and C304, and is a low-Q multiple-feedback bandpass filter. A Treble Blend is provided by U301A, variable resistor VR300, and resistor R309. Variable resistor VR300 blends between treble boost and cut. The output level is scaled by resistor R309.

Bass is provided by U301B, resistors R310 and R311, capacitors C302 and C303, and variable resistor VR301, which provide a resonant bass boost and cut. Resistors R312 and R313 provide a unity-gain allpass. The output is scaled by resistor R314

The Summer 1650 is comprised by U301C and resistor R315. The summer sums the outputs from the various equalization filters. Variable resistor VR302 controls the volume of the power amplifier, which is depicted in FIG. 5C.

FIG. 5C depicts a power amplifier portion of the amplifier and is comprised of transistors Q400-Q408, Zener diodes D400-D401, capacitor C400 and resistors R400-R409. In this embodiment, the power amplifier is a transconductance amplifier and operates in a manner similar to the transconductance amplifier including the distortion device 1000 described in FIG. 4, with the following additions and/or exceptions. Q400 is a Darlington transistor. Zener diodes D400 and D401 help to reduce the dissipation of matched transistors Q401 and Q405. Resistors R406 and R410 are wire-wound power resistors. Transistors Q403 and Q407 are medium power transistors. Q404 and Q408 are power transistors. All four of these transistors are mounted to and insulated from a common heat sink to reduce thermal runaway. Resistor R409 provides negative feedback to help make the output linear.

Figure 6:
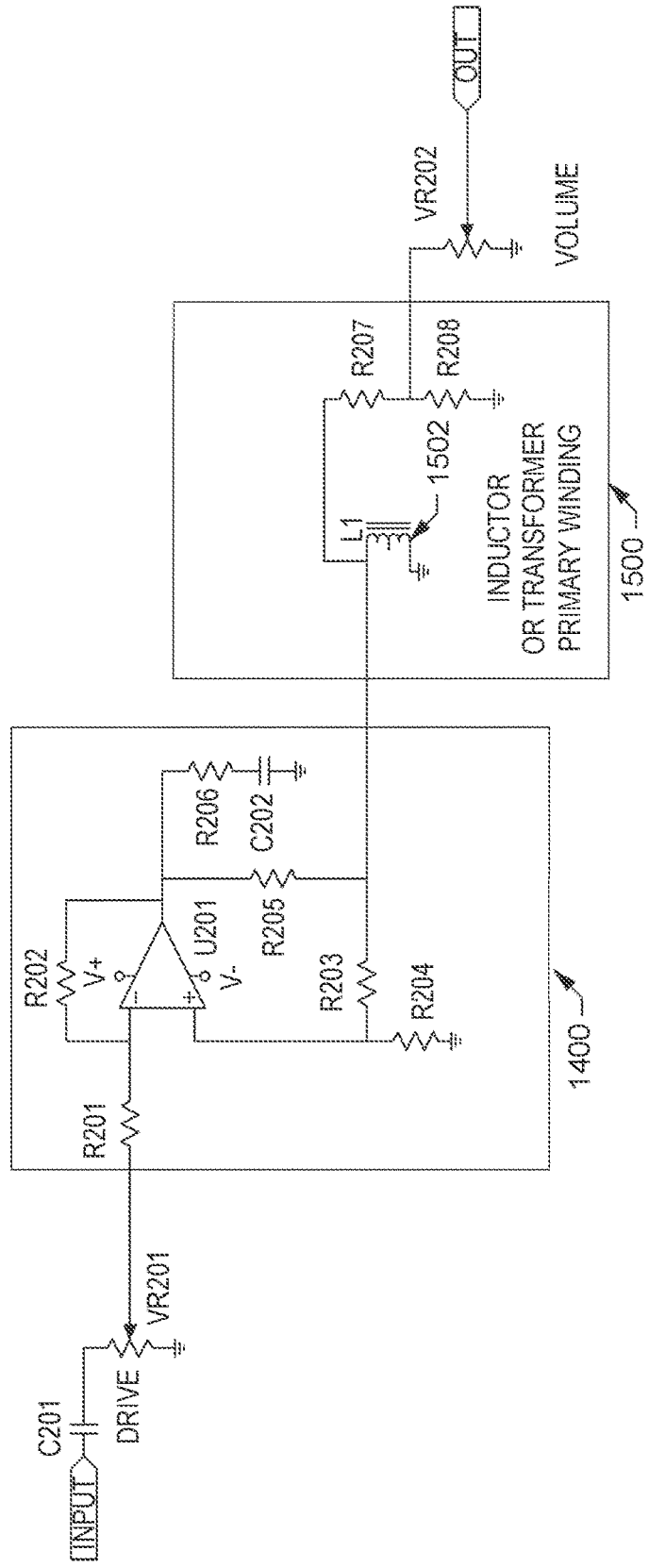
FIG. 6 depicts aspects of an embodiment of the distortion device of the present invention.

FIG. 6 is an embodiment of the circuitry associated with an embodiment of the present invention that utilizes an inductor L1 as a component in an inductive distortion device 1000 that can be integrated into an amplifier. A further embodiment of this circuitry utilizes a transformer, rather than inductor L1 in the inductor or transformer section 1500 of the distortion device 1000. Although FIG. 6 contains specific circuit elements, one of skill in the art will recognize that many variations exist that can employ the innovations of the present invention and are considered embodiments of this invention. FIG. 6 is offered as an illustrative non-limiting example of possible circuitry that can be utilized in embodiments of the present invention.

Returning to FIG. 6, for ease of understanding, the circuitry is separated into a transconductance stage 1400 and an inductor section 1500.

The transconductance stage 1400 uses a power operational amplifier configured as a bilateral current source. R201, R202, R203 and R204 and the opamp act as a differential amplifier. The inverting input to the differential amplifier is the voltage from the centertap of VR201. The non-inverting input is the output voltage to the inductor. Assuming that R201=R202=R203=R204, then the voltage drop across R205 must equal the negative of the voltage input into R201. As an example, if R205=10 ohms, a 1 volt input to R201 would result in a −0.1 ampere current flow through the inductor. Transconductance is the inverse of resistance, i.e., transconductance=current/voltage. Therefore, the transconductance of this stage with R205=10 ohms would be 0.1 ampere/1 volt=0.1 Siemens.

Depending on the operational amplifier chosen, R206 and C202 may be required to prevent unwanted oscillation.

Embodiments of the present invention utilize a transconductance amplifier or other current-output devices, including but not limited to, vacuum tubes, to drive an inductor, such as inductor L1 in FIG. 6. In an embodiment of the present invention, a voltage-output amplifier with current-limiting or current-control devices could also be utilized. In an embodiment of the present invention, the inductor can also be placed in a feedback loop around a high-power op amplifier.

Returning to FIG. 6, the inductor voltage is reduced by the voltage divider and then routed through volume control variable resistor VR202, to a power amplifier stage, reverberation, and an effects loop (not pictured).

Embodiments of the present invention utilize a transconductance amplifier or other current-output devices, including but not limited to, vacuum tubes, to drive an inductor. In an embodiment of the present invention, a voltage-output amplifier with current-limiting or current-control devices could also be utilized, as illustrated in FIG. 7.

Figure 7:
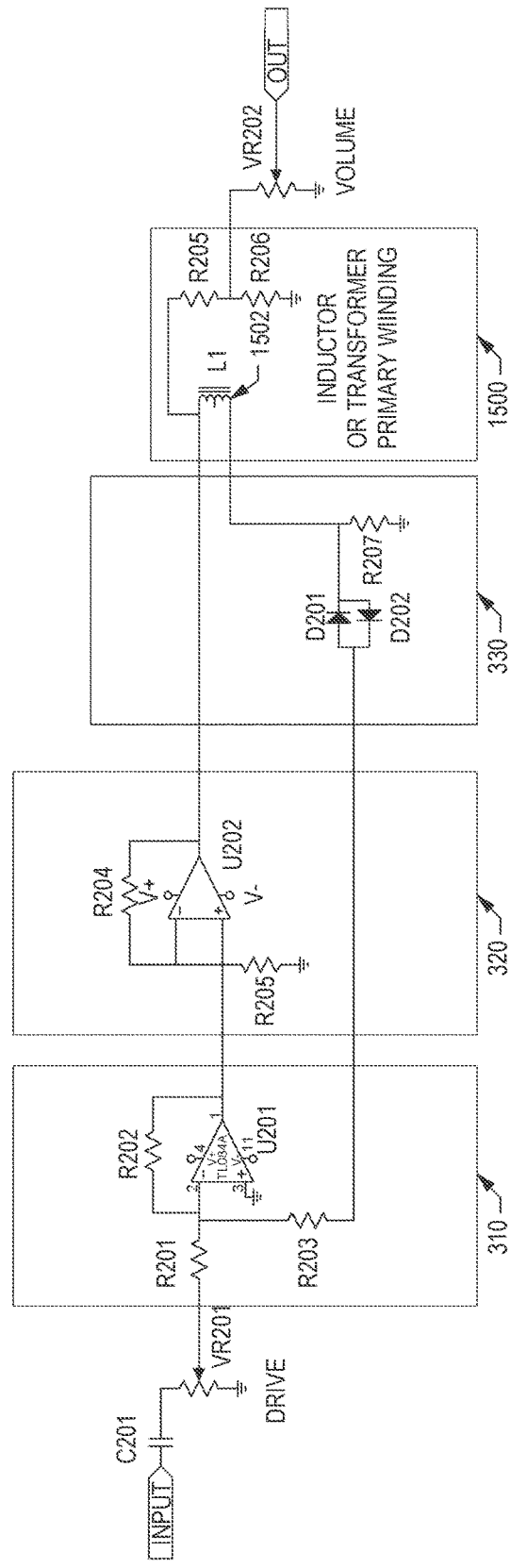
FIG. 7 depicts aspects of an amplifier that includes an embodiment of the distortion device of the present invention.

FIG. 7 is an embodiment of the circuitry associated with an embodiment of the present invention that utilizes an inductor L1 or a transformer as a component in an inductive distortion device 1000 that can be integrated into an amplifier. Although FIG. 7 contains specific circuit elements, one of skill in the art will recognize that many variations exist that can employ the innovations of the present invention and are considered embodiments of this invention. FIG. 7 is offered as an illustrative non-limiting example of possible circuitry that can be utilized in embodiments of the present invention.

Returning to FIG. 7, for ease of understanding, the circuitry is separated into an inverting summing amplifier 310, a voltage amplifier 320, a current-sense circuit 330 and an inductor portion 1500.

The summing amplifier inverts the input signal from the centertap of VR201 and multiplies it by the ratio of −R202/R201. A current feedback signal from 330 is subtracted from the input by the ratio of −R203/R202.

Power amplifier 320 consists of power operational amplifier U202 and resistors R204 and R205. The AC voltage signal from summing amplifier 310 is multiplied by 1+R204/R205.

Current sense circuit 330 consists of current sense resistor R207 and diodes D201 and D202. R207 is selected such that as the current in L1 approaches the desired maximum current, the voltage drop across it reaches about 0.6 volts. Diode D201 begins to conduct at about −0.6 volts on the negative half-cycle and diode D202 begins to conduct at about +0.6 volts on the positive half-cycle. The resultant voltage is then sent to R201 of summer amplifier 310, where it is subtracted from the input voltage, thus limiting the current to inductor L1.

Returning to FIG. 7, the inductor voltage is reduced by voltage divider R205 and R206 and then routed through volume control variable resistor VR202, to a power amplifier stage, reverberation, and/or effects loop (not pictured).

Figure 8:
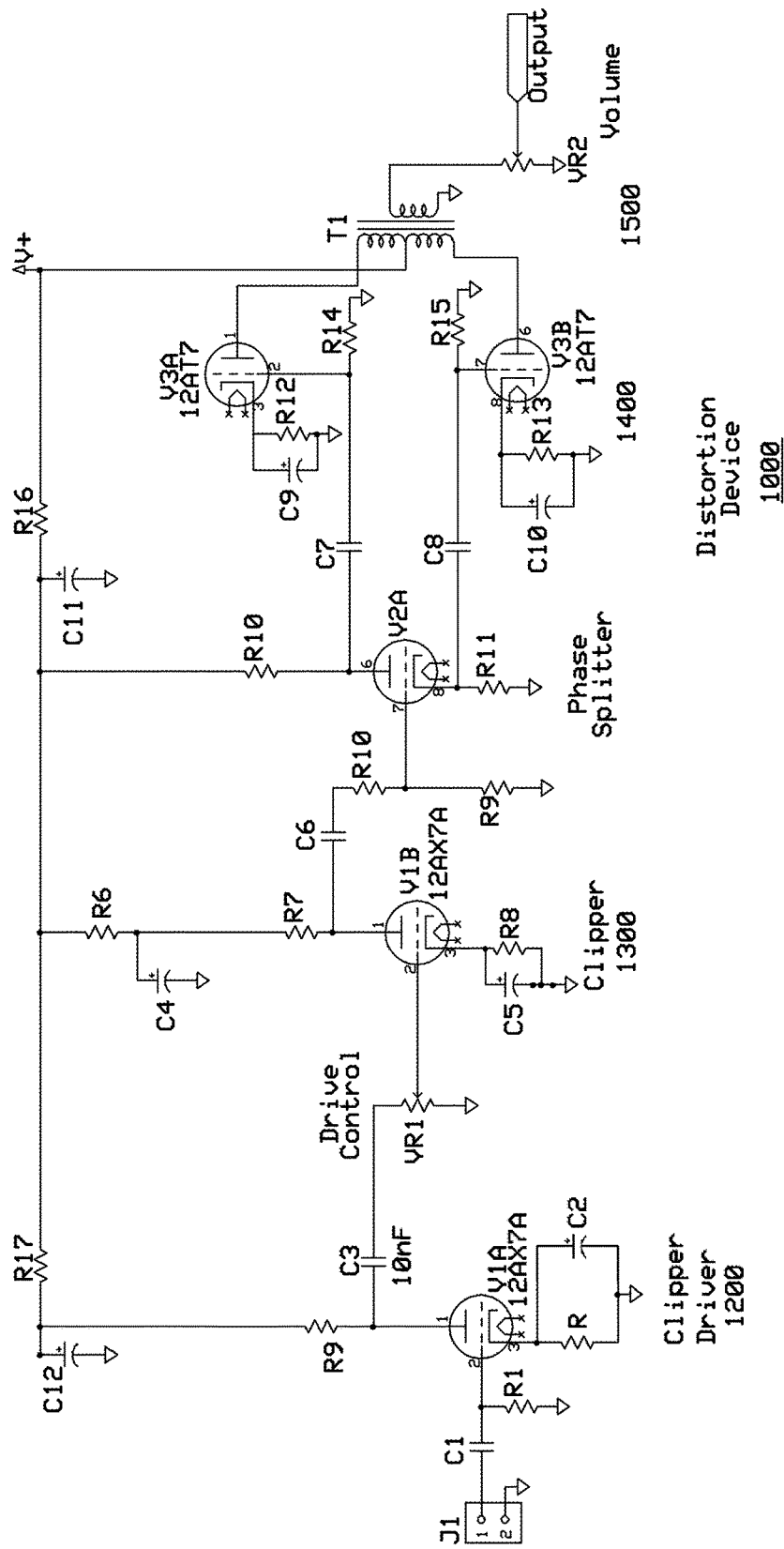
FIG. 8 depicts a tube amplifier that includes an embodiment of the distortion device of the present invention.

FIG. 8 is an example of a vacuum tube circuit that may be used in an embodiment of the present invention that utilizes a transformer portion in the aforementioned inductor or transformer section 1500 of a distortion device 1000 of the present invention, as described earlier. AS explained earlier in FIG. 3, for example, in FIG. 8, the input is amplified by a clipper driver 1200 (FIG. 3). In the embodiment of FIG. 8, the clipping level of clipper 1300 (FIG. 3) is set by Drive Control potentiometer VR1. The output level of clipper 1300 is set by voltage divider R9-R10, such that transformer T1 will go into saturation when clipper 1300 goes into clipping, thus approximating the distortion characteristic of a classic tube amplifier. In this embodiment of the present invention, phase splitter V2A provides inverted and non-inverted drive to the conventional Class AB amplifier comprised of V3A, V3B, transformer T1 and associated components. The secondary of T1 provides a low-level signal to VR2. The output may be used to drive equalization, reverberation, effects and a power amplifier.

Figure 9:
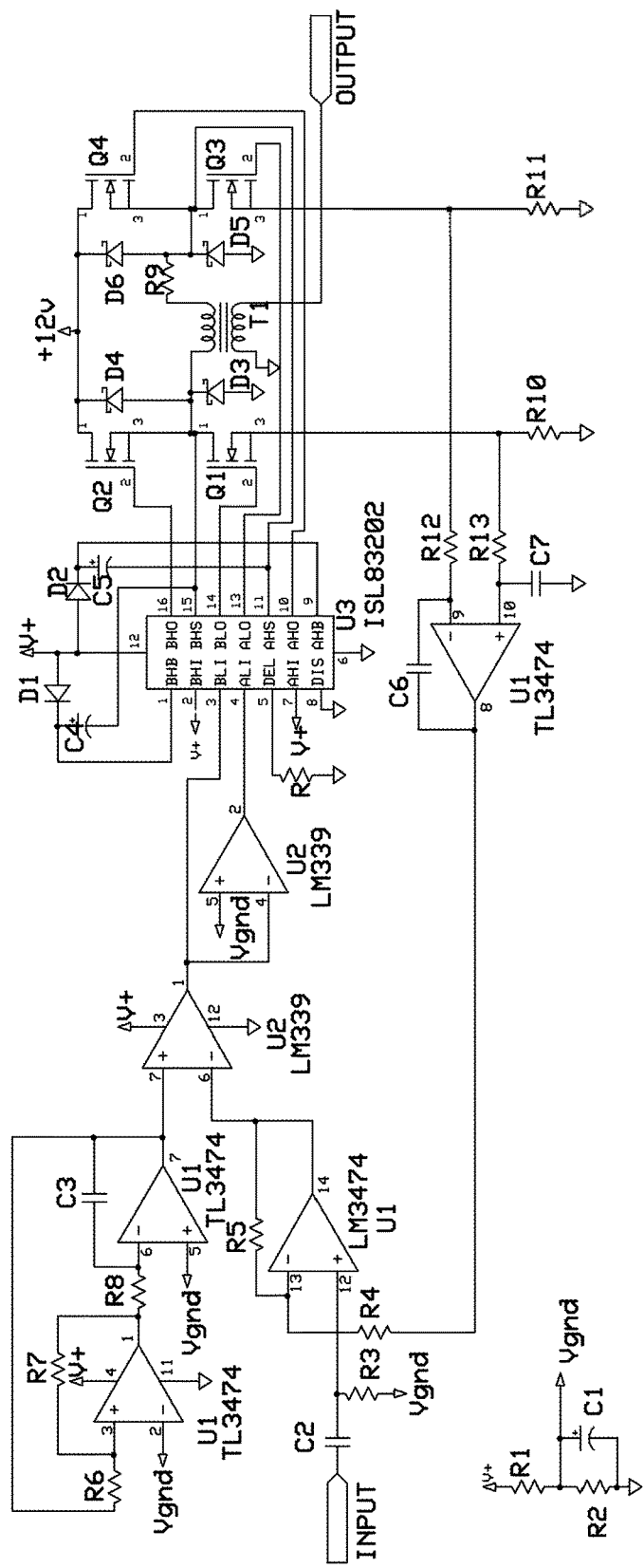
FIG. 9 depicts an example of the driver for an embodiment of the present invention.

Referring to FIG. 9, an embodiment of the present invention is configured as a Class-D transconductance amplifier. As understood by one of skill in the art, Class-D is a high-speed switching circuit which allows higher efficiency than a linear amplifier. Thus, FIG. 9 is an example of a driver for an embodiment of the present invention that utilizes a transformer. In an embodiment of the present invention, the pictured driver can be utilized both to drive the transformer as well as in a power amplification section of an embodiment of the distortion device.

Figure 11:
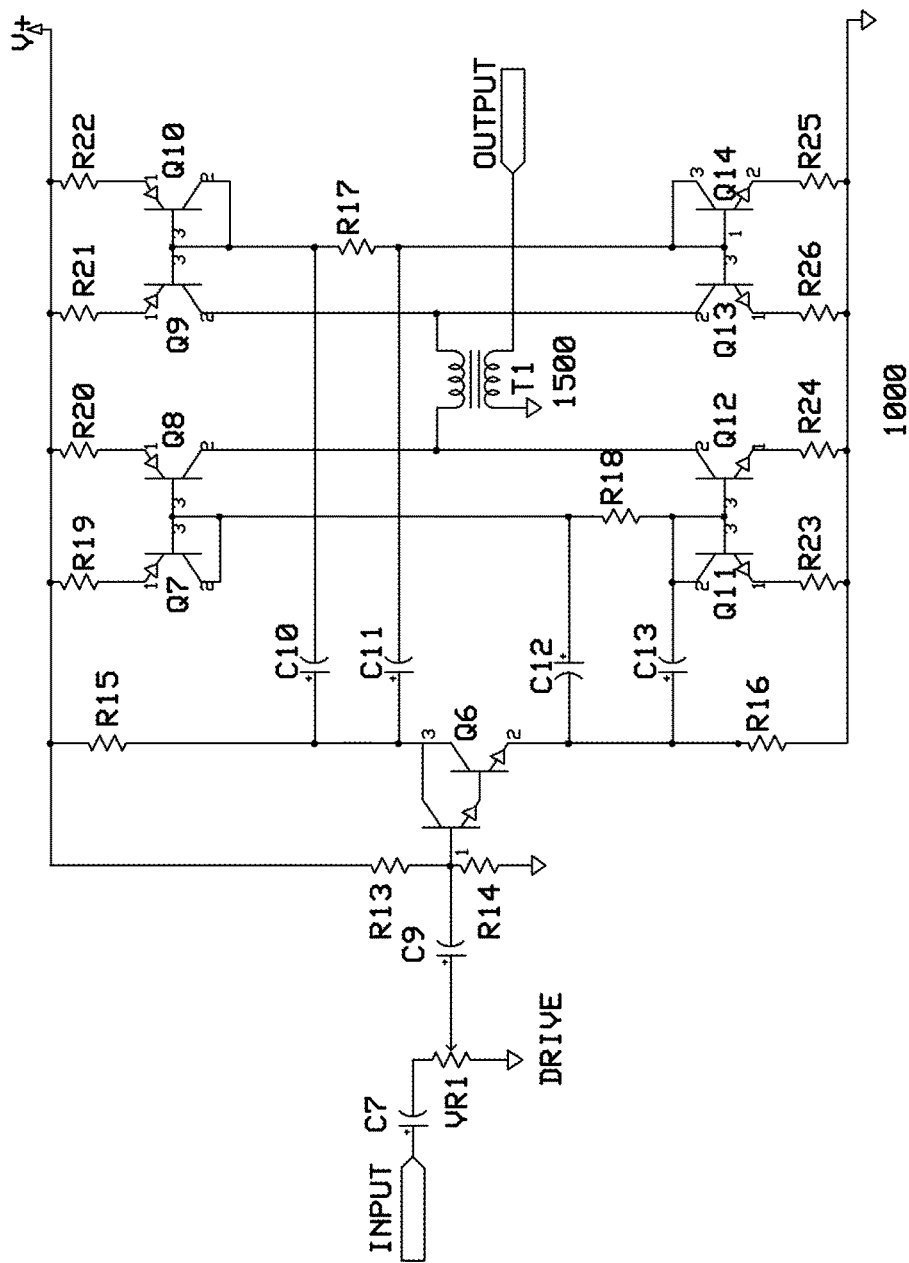
FIG. 11 depicts an example of the driver for an embodiment of the present invention.

FIG. 11 is an example of the driver for an embodiment of the present invention that utilizes a transformer. The advantage of the H-bridge in an embodiment of the present invention is that it uses a single power supply voltage, which may result in cost savings. In one example, by utilizing the H-bridge circuit, the distortion device draws the same a single 30V supply as embodiments lacking this component draw from a dual +/−30V. Like the driver in FIG. 9, the driver in FIG. 11 may also be utilized in the power amplification section of the circuitry comprising an embodiment of the present invention.

Figure 12A:
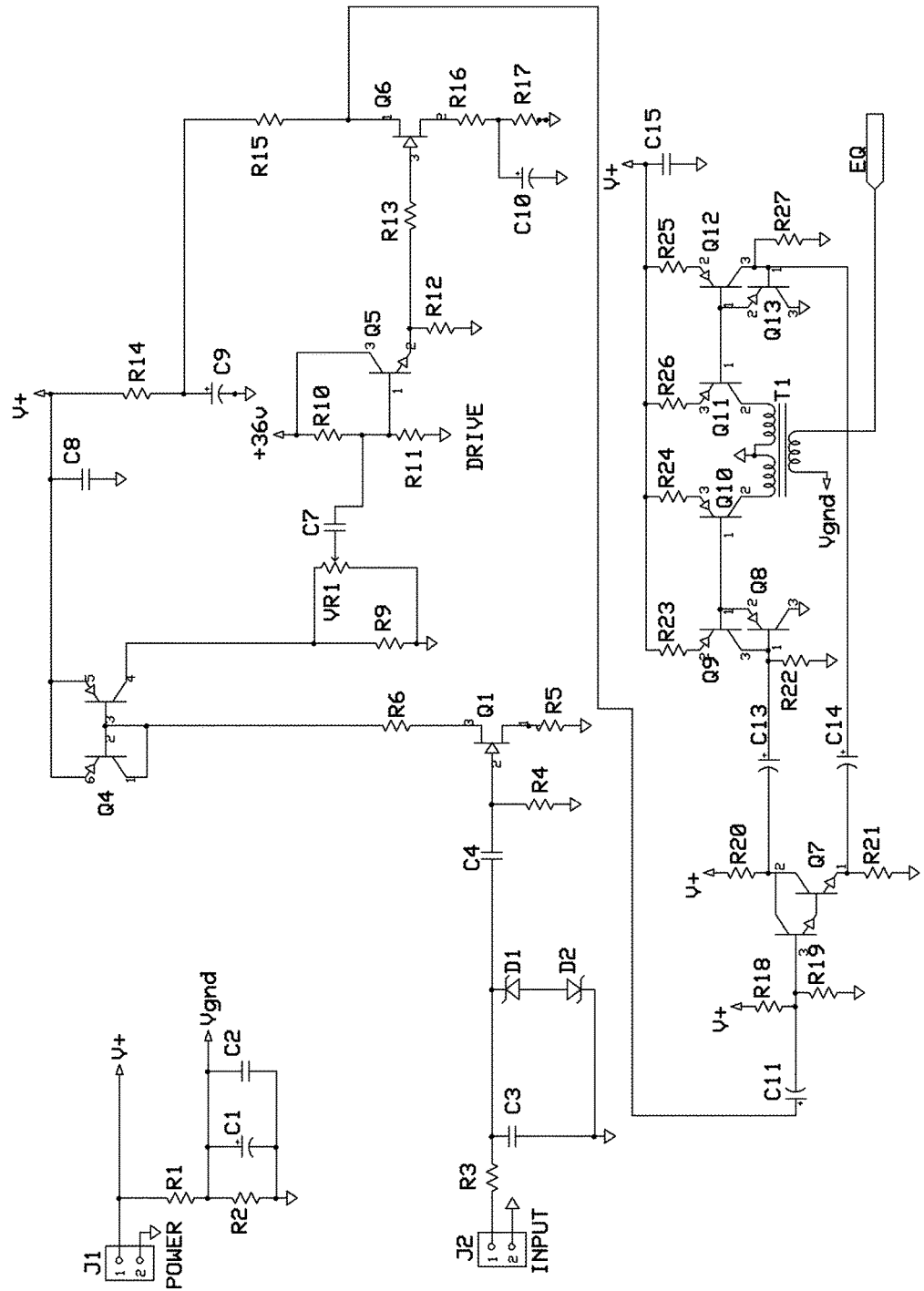
FIGS. 12A-12C depict aspects of an example of an amplifier that incorporates an embodiment of the distortion device of the present invention.
Figure 12B:
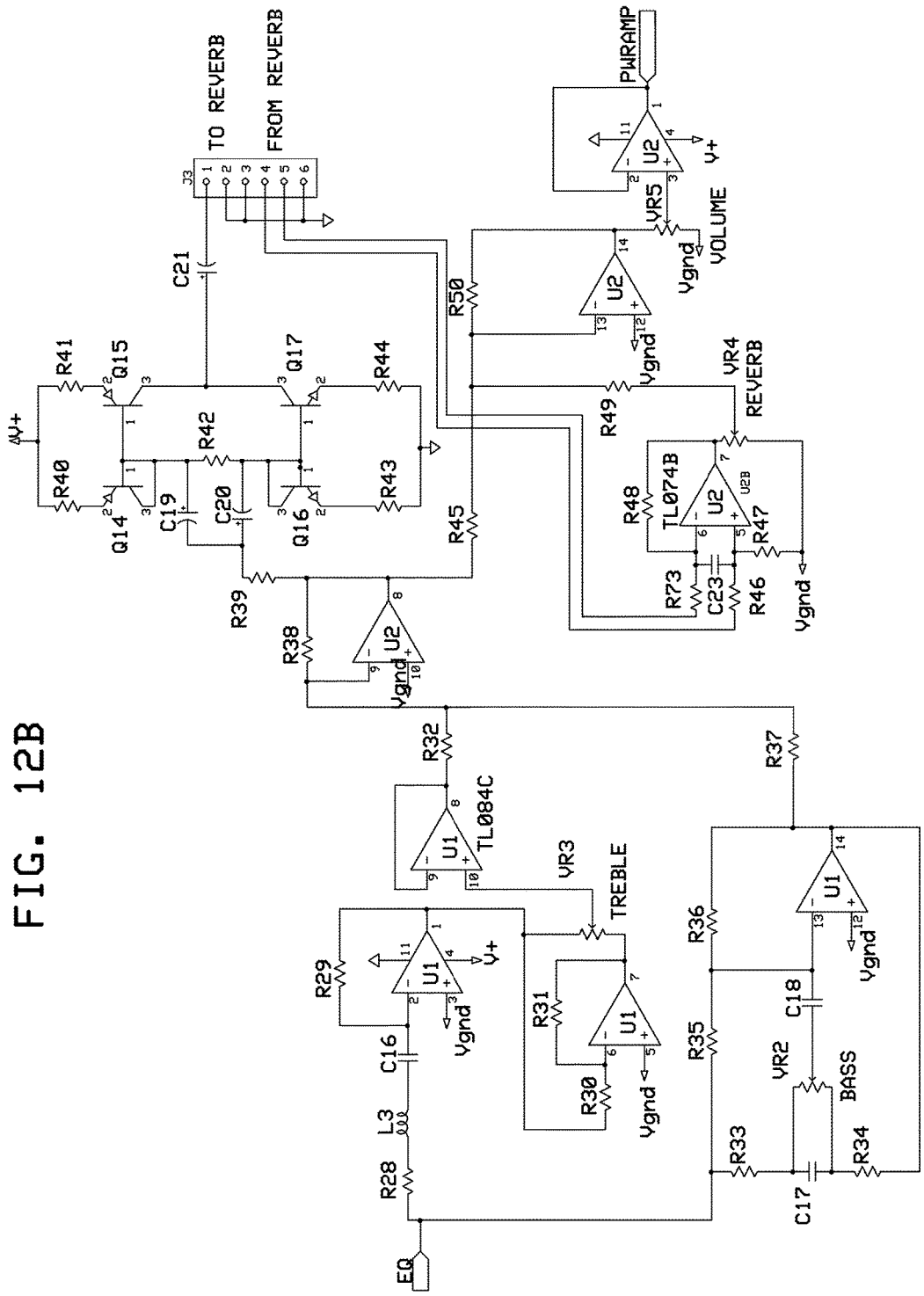
Figure 12C:
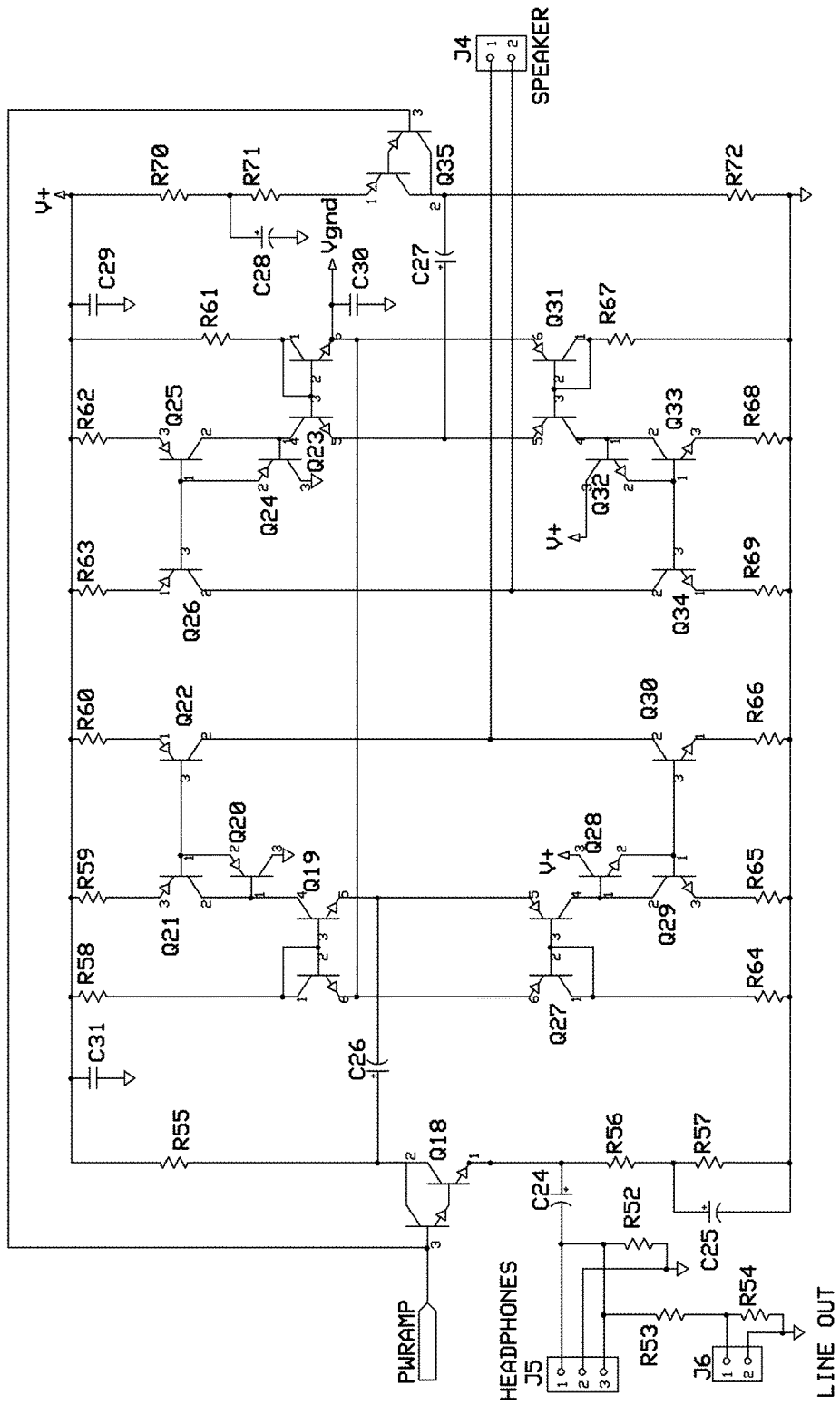

FIGS. 12A-12C depict aspects of an example of an amplifier that incorporates an embodiment of the distortion device of the present invention. In particular, this embodiment utilizes the disclosed H-bridge circuit that is an aspect of the driver of FIG. 11 as a power amplifier. A conventional push-pull circuit is used to drive the center-tapped primary of T1. As aforementioned, one advantage in utilizing this push-pull circuit and H-bridge circuit is that it increases the cost efficiency of the device and therefore, of the amplifier as a whole. FIG. 12A depicts pre-amplification stages, FIG. 12B depicts equalization, and FIG. 12C depicts power amplification.

Another advantage of the present distortion device is that embodiments of the present device can be utilized as part of an amplification system that is smaller than most comparable amplification systems which do not include the distortion capabilities of the device. For example, the disclosed components of the amplifier of FIGS. 12A-12C can fit on an 8×2.5" circuit board.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the descriptions below, if any, are intended to include any structure, material, or act for performing the function in combination with other elements as specifically noted. The description of the technique has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A distortion device, comprising:
a transconductance stage;
a current amplifier stage electrically coupled to the transconductance stage; and
a transformer portion electrically coupled to the current amplifier stage,
wherein the transconductance stage comprises a first capacitor to provide a ground to a resistor, and wherein voltage across the resistor develops a current through a second capacitor to the current amplifier stage,
wherein the current amplifier stage comprises a positive half cycle and a negative half cycle, wherein the positive half cycle and the negative half cycle amplify the current from the transconductance stage and supply the amplified current to a primary winding of a transformer in the transformer portion, and
wherein an output of the transformer portion comprises a low-level signal.

2. The distortion device of claim 1, the transformer portion further comprising a secondary winding.

3. The distortion device of claim 2, wherein the transformer portion further comprises a resistor to provide a resistive load, and wherein the resistive load is reflected into the primary winding.

4. The distortion device of claim 1, wherein the current amplifier stage comprises a current-output device to drive the transformer in the transformer portion.

5. The distortion device of claim 1, further comprising a power amplifier stage, wherein the output from the transformer portion is routed through a volume control variable resistor to the power amplifier stage.

6. The distortion device of claim 1, wherein the transformer is placed in a feedback loop around a high-power op amplifier.

7. The distortion device of claim 1, wherein the input to the current amplifier stage is a virtual ground.

8. The distortion device of claim 1, wherein a current source is accessed by the transformer portion to utilize the current to limit saturation in the transformer portion.

9. The distortion device of claim 1, wherein the transformer portion is driven by at least one of: a transconductance amplifier, a current-output device, or a vacuum tube.

10. An amplifier comprising a distortion device, wherein the distortion device comprises:
   a signal source;
   a transconductance stage coupled to the signal source, wherein the transconductance stage comprises a capacitor to provide a ground to a resistor, and wherein a voltage across the resistor develops a current through the capacitor to a current amplifier stage;
   the current amplifier stage, wherein the current amplifier stage comprises a positive half cycle and a negative half cycle, to amplify the current from the transconductance stage to supply the amplified current to a saturation portion; and
   the saturation portion, wherein the saturation portion comprises a transformer, and wherein the transformer is supplied amplified current by collectors of transistors in the current amplifier stage.

11. The amplifier of claim 10, further comprising:
   a power amplifier stage, wherein the power amplifier stage obtains output from the transformer.

12. The amplifier of claim 10, wherein the amplified current is supplied to a primary winding of the transformer.

13. The amplifier of claim 10, wherein the amplified current is supplied to a resistor that provides a resistive load for the transformer.

14. The amplifier of claim 10, further comprising:
   a clipper stage electrically coupled to the transconductance stage, wherein the clipper stage comprises a clipper driver coupled to a clipper, the clipper configured to clip an input signal at least one of a positive extremity or a negative extremity and to supply the clipped signal to the transconductance stage.

* * * * *